United States Patent [19]

Takayama

[11] Patent Number: 4,910,799

[45] Date of Patent: Mar. 20, 1990

[54] NOISE REDUCTION APPARATUS

[75] Inventor: Kazuo Takayama, Kobe, Japan

[73] Assignee: Fujitsu Ten Limited, Kobe, Japan

[21] Appl. No.: 406,862

[22] Filed: Sep. 12, 1989

Related U.S. Application Data

[63] Continuation of Ser. No. 117,197, filed as PCT JP87/00047 on Jan. 24, 1987, published as WO87/04578 on Jul. 30, 1987, abandoned.

[30] Foreign Application Priority Data

Jan. 25, 1986 [JP] Japan .................................. 61-12982

[51] Int. Cl.⁴ ......................... H04B 1/10; H04L 27/10

[52] U.S. Cl. .................................... 455/296; 455/304; 455/306; 375/57; 375/103

[58] Field of Search ............... 455/302, 303, 304, 306, 455/314, 315, 296, 307, 254, 210, 213, 295; 375/77, 58, 99, 100, 102, 103, 51, 57

[56] References Cited

U.S. PATENT DOCUMENTS 3,947,636 3/1976 Edgar .................................. 455/303
4,304,004 12/1981 Von der Neyen .................. 375/102
4,501,004 2/1985 Yoshida et al. ...................... 305/102
4,648,127 3/1987 Jongepier ............................ 455/303

*Primary Examiner*—Reinhard J. Eisenzopf
*Assistant Examiner*—Curtis A. Kuntz
*Attorney, Agent, or Firm*—Staas & Halsey

[57] ABSTRACT

A noise reduction apparatus in which an input signal is supplied to a first signal path (2) including a variable low-pass filter (2) and a second signal path (1), a control circuit (4) control is such that a cut-off frequency of the variable low-pass filter (2) is varied in accordance with a frequency of the input signal S(1), and an output signal is obtained from the first signal path when noise is generated and from the second signal path when noise is not generated.

16 Claims, 8 Drawing Sheets

NOISE REDUCTION APPARATUS

This is a continuation of co-pending application Ser. No. 07/117,197 filed as PCT JP87/00047 on Jan. 24, 1987, published as WO87/04578 on Jul. 30, 1987, abandoned.

TECHNICAL FIELD

The present invention relates to a noise reduction apparatus suitable for removing an intermittently generated instantaneous noise. The noise reduction apparatus according to the present invention is incoporated in, e.g., an FM radio receiver for an automobile, to remove noise such as multipath distortion.

BACKGROUND ART

It is well known that a multipath disturbance is generated in an FM radio receiver for an automobile, and that this multipath disturbance is caused by a multipath distortion of a demodulated signal of a received wave, which is generated by interference between a direct wave of a radiowave and a reflected wave thereof reflected by a mountain, a building, or the like. This multipath distortion degrades the sound quality of a demodulated aural signal.

As shown in FIG. 3, multipath distortion is a high frequency instantaneous noise intermittently superimposed on a demodulated signal. To remove this multipath distortion, if a demodulated signal is passed through a low-pass filter during generation of the multipath disturbance, the multipath distortion mainly consisting of a high frequency component is reduced and cannot be aurally detected.

Conventionally, an apparatus using a variable low-pass filter is known as a noise reduction apparatus. In this apparatus, a demodulated signal is passed through a variable low-pass filter and a noise detecting circuit is provided for outputting a detection signal throughout a period in which a multipath distortion is intermittently generated when the intermittent multipath distortion is superimposed on the demodulated signal. When the multipath distortion is detected, a cut-off frequency of the variable low-pass filter is set at a fixed low frequency value in response to a detection signal from the noise detecting circuit, to remove the multipath distortion consisting of the high frequency component. When a multipath distortion is not detected, the cut-off frequency is set at a high frequency to pass the demodulated signal without digradation.

This noise reduction apparatus removes the high frequency component of an input signal throughout the entire period in which a noise is intermittently generated, and the high frequency component of the input signal is inevitably degraded when the noise reduction ratio is increased.

The following relationship is generally present between noise such as a multipath distortion and a signal on which the noise is superimposed.

When the signal does not include a high frequency component, a high frequency noise stands out, but when the signal includes a high frequency component, the noise does not stand out. Therefore, in the former case, the noise must be removed, but in the latter case, the removal of the noise is not necessary and only significant noise need be removed, i.e., noise need be removed only slightly.

Since noise is normally at a constant level, the S/N ratio is degraded when a signal level is low and is not degraded when the signal level is high. Therefore, in the former case, noise must be removed, and in the latter case, noise need be removed only slightly. Assuming that a signal level is constant, the S/N ratio is degraded when a noise level is high and is not degraded when the noise level is low. Therefore, in the former case, noise must be removed, and in the latter case, noise need be removed only slightly.

However, a conventional noise reduction apparatus as described above does not consider such a relationship between a signal and noise, and always carries out a noise reduction processing with a consistent characteristic, i.e., processing wherein a cut-off frequency of a variable low-pass filter is set at a fixed low frequency and a signal is passed through the variable filter, and consequently, does not perform a proper noise reduction.

Accordingly, it is an object of the present invention to provide a noise reduction apparatus capable of varying a noise reduction characteristic in accordance with a frequency or a level of a signal to be subjected to noise reduction, thereby effectively removing noise.

DISCLOSURE OF THE INVENTION

According to the present invention, there is provided a noise reduction apparatus capable of removing instantaneous noise superimposed on an input signal, and having a noise detecting circuit for detecting the noise from the input signal, a first signal path including a variable low-pass filter capable of varying a cut-off frequency, the input signal being output through the variable low-pass filter, a second signal path through which the input signal is passed, a control circuit for regulating the cut-off frequency of the variable low-pass filter in accordance with a frequency of the input signal, and a selecting circuit for selecting an output signal from the first signal path during a period in which noise is detected by the noise detecting circuit, and selecting an output from the second signal path during a period in which noise is not detected.

BRIEF DESCRIPTION OF THE DRAWINGS

Preferred embodiments of a noise reduction apparatus according to the present invention will now be described below with reference to the accompanying drawings in which.

BEST MODE FOR CARRYING OUT THE INVENTION

Figure 1:
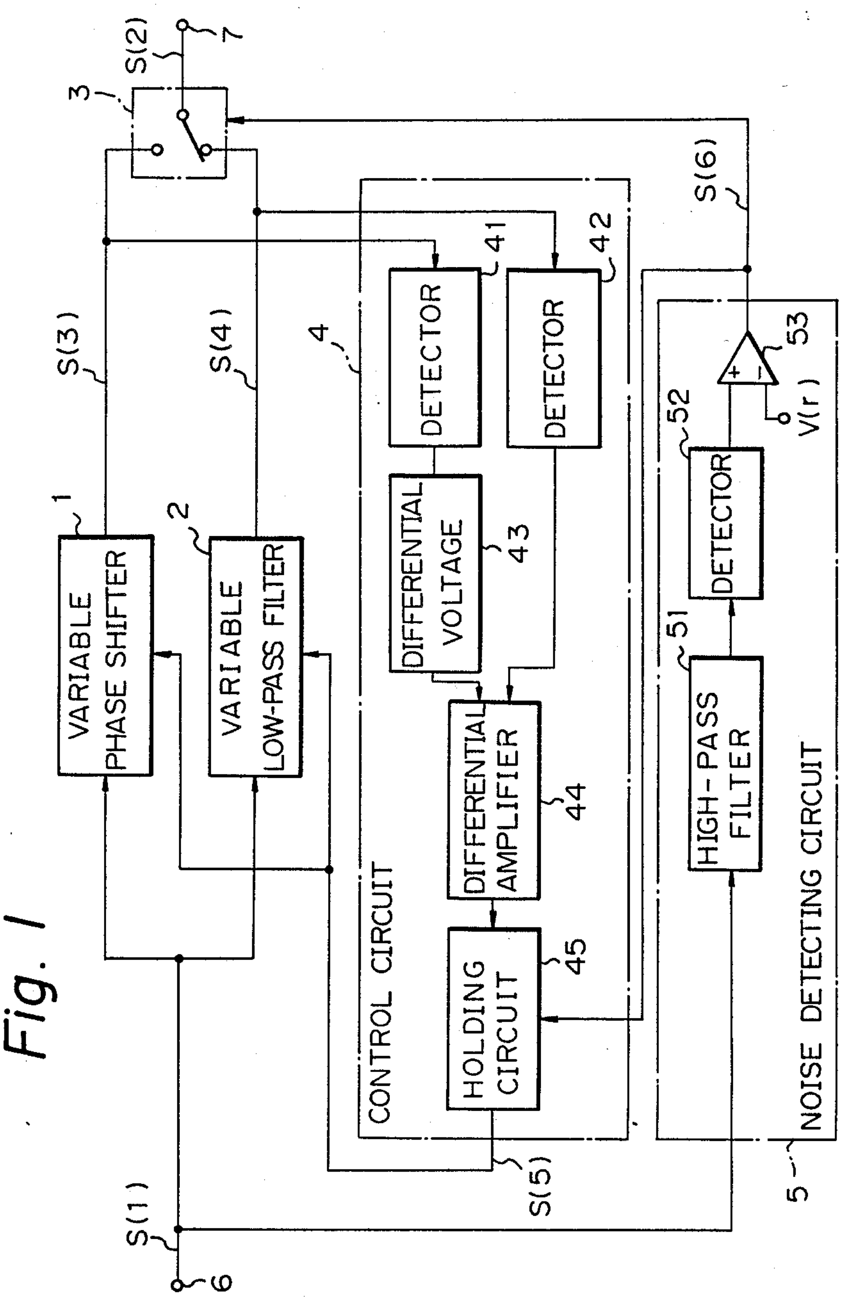
FIG. 1 is a block diagram of a noise reduction apparatus according to an embodiment of the present invention.

FIG. 1 is a block diagram of a noise reduction apparatus according to an embodiment of the present invention. In FIG. 1, an input signal S(1) input to an input terminal 6 is divided by two and supplied to a variable phase shifter 1 and a variable low-pass filter 2, respectively, and outputs therefrom are supplied to a selector 3, respectively. An output signal S(2) from the selector 3 is sent from an output terminal 7 to an external circuit.

An output signal S(3) of the variable phase shifter 1 and an output signal S(4) of the variable low-pass filter 2 are supplied to detectors 41 and 42 of a control circuit 4, respectively. The control circuit 4 comprises detectors 41 and 42, a differential voltage circuit 43 for supplying a differential voltage δ to a detected output of the detector 41, a differential amplifier 44 for amplifying a difference between the outputs of the detector 42 and the differential voltage circuit 43, and a holding circuit 45 for temporarily holding an output signal of the differential amplifier 44 in accordance with a noise detection signal S(6). A control signal S(5) output from the holding circuit 45 is supplied to control input terminals of the variable phase shifter 1 and the variable low-pass filter 2.

The input signal S(1) is also supplied to a noise detecting circuit 5. The noise detecting circuit 5 comprises a high-pass filter 51, a detector 52 for detecting an output signal of the high-pass filter 51, and a comparator 53 for comparing an output signal of the detector 52 with a reference voltage V(r). The noise detecting circuit 5 detects noise having a high frequency component superimposed on the input signal S(1), and outputs a noise detection signal S(6) indicating a period of noise generation. The noise detection signal S(6) is supplied to a select control input terminal of the selector 3 and a hold control input terminal of the control circuit 4.

An operation of the noise reduction apparatus will be described below. The input signal S(1) input to the input terminal 6 is divided by two and supplied to the variable phase shifter 1 and the variable low-pass filter 2. the variable low-pass filter 2 is a low-pass filter for removing high frequency noise superimposed on the input signal S(1), and the cut-off frequency thereof is always variably controlled by the control circuit 4 so as to substantially correspond to the frequency of a major component of the input signal S(1), as will be described later in detail.

The variable phase shifter 1 serves as a delay element for supplying an input signal with a delay time having a same duration as that of a transmission delay time of a signal generated by the variable low-pass filter 2, so that a time difference is not generated between the output signal S(3) from the variable phase shifter 1 and the output signal S(4) from the variable low-pass filter 2 at the time of a switching operation of the selector 3.

Since the delay time of the signal generated by the variable low-pass filter 2 varies in accordance with changes in the cut-off frequency thereof, the delay time (phase angle) of the variable phase shifter 1 is varied in accordance with changes in the cut-off frequency of the variable low-pass filter 2, according to the control signal S(5) from the control circuit 4, so as to have the same phase-frequency characteristic as that of the variable low-pass filter 2, whereby the phases of the signals passed through both paths respectively coincide with each other at the selector 3.

Figure 2A:
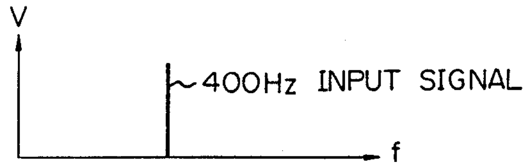
FIGS. 2A, 2B, and 2C are graphs for explaining an operation of a control circuit in FIG. 1.
Figure 2B:
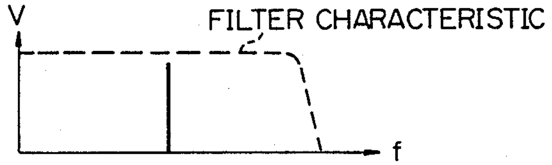

The cut-off frequency of the variable low-pass filter 2 is controlled by the control circuit 4 as follows. Assume that a signal of 400 Hz as shown in FIG. 2A is input as the input signal S(1). The input signal S(1) passes through the variable phase shifter 1 and the variable low-pass filter 2 and is then detected by the detectors 41 and 42 respectively. When the cut-off frequency of the variable low-pass filter 2 is higher than the frequency of the input signal S(1), as shown in FIG. 2B, the detected output levels of the detectors 41 and 42 are the same.

On the other hand, since the detected output of the detector 41 is reduced by an amount of the predetermined differential voltage δ by the differential voltage circuit 43, the differential voltage δ between the differential voltage circuit 43 and the detector 42 is supplied to the differential amplifier 44 as an input signal and is then amplified and supplied to the variable phase shifter 1 and the variable low-pass filter 2 through the holding circuit 45 as the control signal S(5), whereby the cut-off frequency of the variable low-pass filter is shifted toward a low frequency side.

Figure 2C:
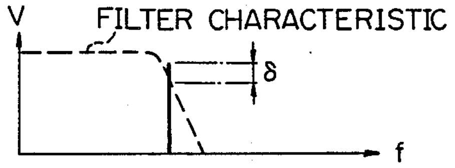

When the cut-off frequency of the variable low-pass filter 2 is shifted to the low frequency side and positioned as shown in FIG. 2C, the input signal S(1) is removed only by an amount corresponding to the differential voltage δ, by a filter characteristic of the variable low-pass filter 2. As a result, the output level of the detector 42 coincides with the output level of the differential voltage circuit 43, and a difference between input signals to the differential amplifier 44 becomes substantially zero. Therefore, the shift of the cut-off frequency of the variable low-pass filter 2 to the low frequency side is stopped, and is set to be a value corresponding to the magnitude of an output signal of the differential amplifier 44 at that time.

As described above, the control circuit 4 outputs the control signal S(5), a voltage value of which varies in proportion to the frequency of the input signal S(1), and the cut-off frequency of the variable low-pass filter 2 and a shifted phase of the variable phase shifter 1 are varied in accordance with the control signal S(5). Therefore, the cut-off frequency of the variable low-pass filter 2 is always controlled to substantially coincide with the frequency of the input signal S(1). In the same way, the shifted phase of the varible phase shifter 1 is varied in accordance with the control signal S(5), whereby the variable phase shifter 1 supplies a delay having the same length as that generated by the variable low-pass filter 2, to the input signal S(1).

Figure 3:
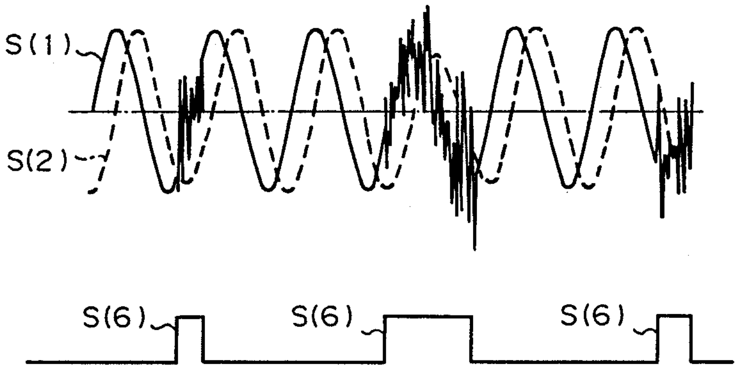
FIG. 3 is a view of a signal waveform for explaining a noise reduction operation of the noise reduction apparatus in FIG. 1.

A noise reduction operation according to the noise reduction apparatus will be described below. Assume that a signal superimposed with a high frequency noise as indicated by a solid line in FIG. 3 is input as the input signal S(1). The noise detecting circuit 5 detects this noise and outputs a noise detection signal S(6) throughout a period in which the noise is generated. The holding circuit 45 holds an output signal from the differential amplifier 44 during the above period in accordance with the noise detection signal S(6) and, therefore, holds the shifted phase of the variable phase shifter 1 and the cut-off frequency of the variable low-pass filter 2 at values before the noise is generated. Therefore, the control circuit 4 is not erroneously operated by noise appearing at an output side of the variable phase shifter 1 during noise generation.

The selector 3 normally selects the output signal S(3) of the variable phase shifter 1 and sends it to the output terminal 7. However, upon reception of the noise detection signal S(6), the selector 3 selects the output signal S(4) of the variable low-pass filter 2 during the noise period. Therefore, during the period in which noise is generated, the input signal from which a high frequency noise is removed by the variable low-pass filter 2, is selected and the output signal S(2) having a waveform as indicated by a broken line in FIG. 3 appears at the output terminal 7.

As described above, according to the noise reduction apparatus of the present invention, the cut-off frequency of the variable low-pass filter 2 which performs the noise reduction operation is always controlled to substantially coincide with the major component frequency of the input signal S(1). As a result, when the high frequency noise is signficant because the input signal S(1) mainly consists of a low frequency component, the cut-off frequency of the variable low-pass filter 2 is set to the low frequency side so that the high frequency noise is sufficiently removed. On the other hand, the input signal S(1) does not include any high frequency component and, therefore, the waveform of the input signal S(1) is not significantly distorted even when the input signal S(1) passes through the variable low-pass filter 2 having a low cut-off frequency. Thus, no practical problem arises.

When the input signal S(1) mainly consists of a high frequency component, the cut-off frequency of the variable low-pass filter 2 is set to the high frequency side, resulting in a small noise reduction effect. However, since the high frequency noise does not aurally stand out in this case, the necessary for carrying out a noise reduction operation is small. On the other hand, since the cut-off frequency of the variable low-pass filter 2 is high, a signal waveform is not significantly distorted when the input signal S(1) is passed through the variable low-pass filter 2.

As described above, according to the present invention, processing with a large noise reduction effect is performed when a sufficient noise reduction operation is needed because the input signal S(1) consists of a low frequency component. Processing with a small noise reduction effect is also performed when the noise reduction operation is not necessary because the input signal S(1) consists of a high frequency component. In either case, an ideal noise reduction operation can be performed, i.e., the waveform of the input signal S(1) can be prevented from significant distortion by the noise reduction processing.

Various modifications can be made in carrying out the noise reduction apparatus of the present invention, and these modifications will now be described below.

Figure 4:
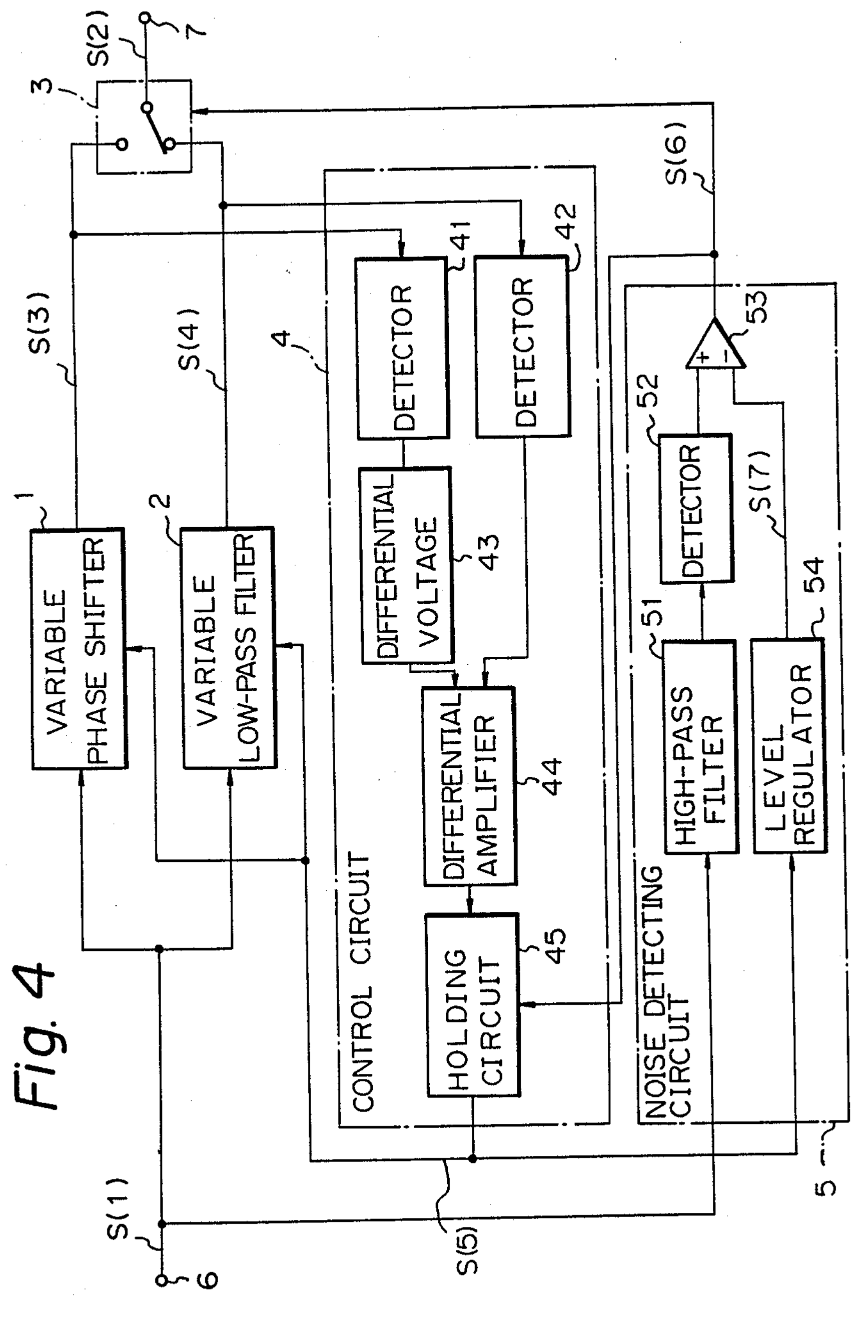
FIGS. 4 and 5 are block diagrams respectively showing other embodiments of the present invention.

FIG. 4 is a block diagram of such a modification of the present invention. As described above, when the input signal S(1) consists of the high frequency component, the necessity for carrying out a noise reduction operation is small, and it is sufficient merely to remove the significant noise with a high noise level. This is accomplished by the modified apparatus. In FIG. 4, the same blocks denoted by the same reference numerals as in FIG. 1 are components having the same functions, and this applies to the following drawings for explaining other modifications.

The difference between the apparatuses shown in FIGS. 1 and 4 is that, in FIG. 4, a reference voltage serving as a comparative reference of the comparator 53 of the noise detecting circuit 5 is supplied from the level regulator 54. The regulator 54 receives the control signal S(5) from the control circuit 4 and the magnitude of the output signal S(7) thereof varies in accordance with the control signal S(5). That is, when the control signal S(5) is varied to increase the cut-off frequency of the variable low-pass filter 2, the output signal S(7) output from the level regulator 54 is varied to increase the comparative reference voltage of the comparator 53, thereby decreasing the noise detection sensitivity of the noise detecting circuit 5. As a result, when the input signal S(1) has a high frequency, the noise detecting circuit 5 detects only noise having a high noise level, and only significant noise is removed.

Figure 5:
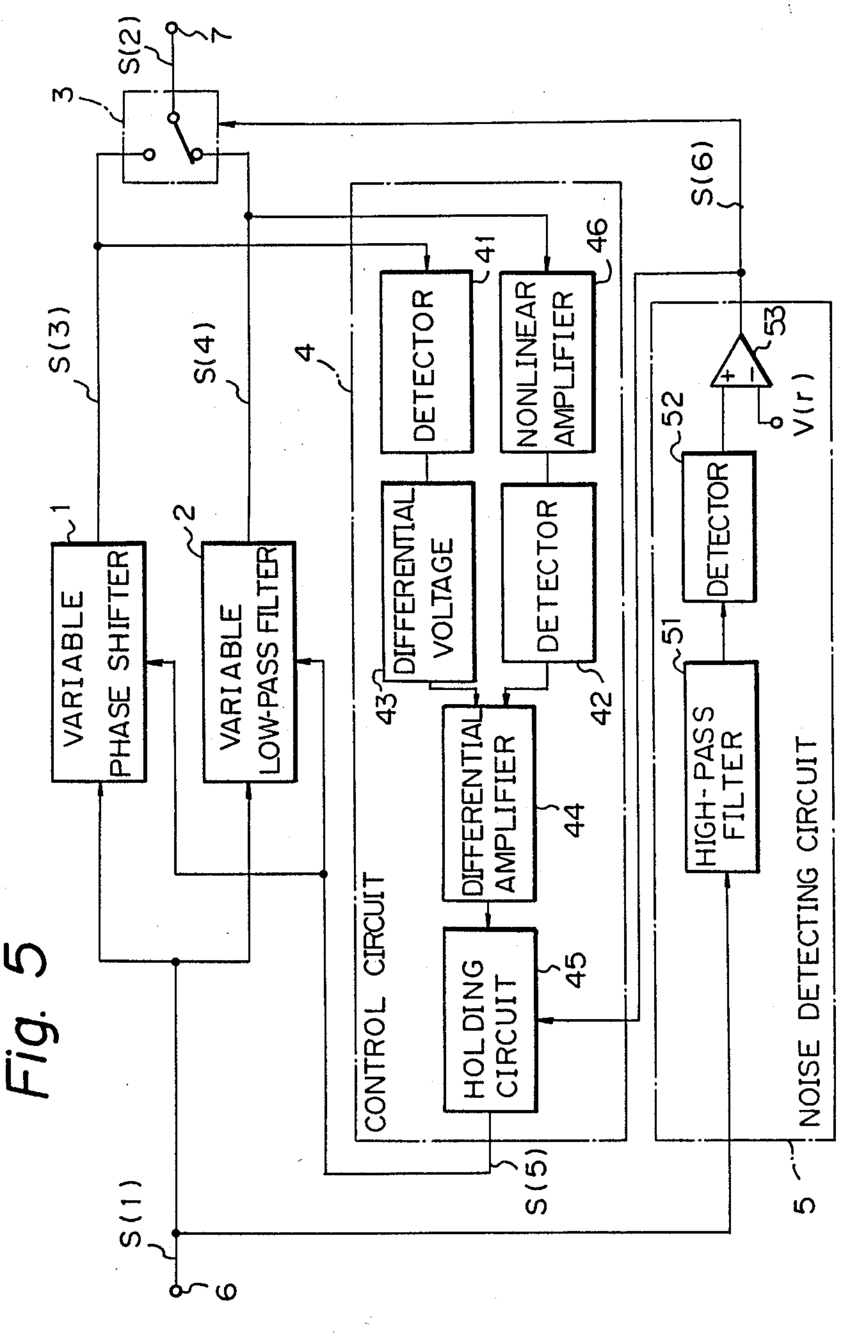

FIG. 5 is a block diagram of another modification of the present invention. In this modified apparatus, when the S/N ratio is good due to the high signal level of the input signal S(1), a degree of shift of the cut-off frequency of the variable low-pass filter 2 toward the low frequency side becomes small, so that the input signal S(1) is not notably distorted by the variable low-pass filter 2, but on the other hand, when the S/N ratio is poor due to the low signal level, a degree of shift of the cut-off frequency of the variable low-pass filter 2 toward the low frequency side becomes large, so as to enhance the noise reduction effect, thereby improving the S/N ratio.

Figure 6:
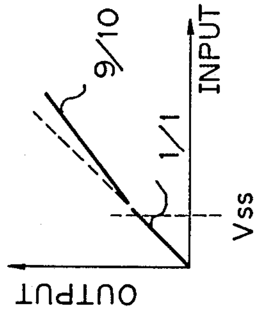
FIG. 6 is a graph of an input to output characteristic of a nonlinear amplifier in FIG. 5.

The difference between this modified apparatus and the apparatus shown in FIG. 1 is that, in this apparatus, the output signal S(1) from the variable low-pass filter 2 is supplied to the detector 42 through a nonlinear amplifier 46. The nonlinear amplifier 46 has an input to output characteristic as shown in FIG. 6. That is, the input to output characteristic curve has a slope of 1 when the signal level of the input signal S(1) is Vss or less, and of 0.9 when the signal level exceeds that level. Thus, the magnitude of the output signal is suppressed as the magnitude of the input signal is increased.

With the nonlinear amplifier 46, the cut-off frequency of the variable low-pass filter 2 substantially coincides with the frequency of the input signal S(1) when the signal level of the input signal S(1) is low. However, when the signal level is increased, the cut-off frequency is set to be higher than the frequency of the input signal S(1), thereby decreasing the noise reduction effect when the signal level of the input signal is high. Thus, in this modified apparatus, the cut-off frequency of the variable low-pass filter 2 can be changed in accordance with both the frequency and the signal level of the input signal.

Figure 7:
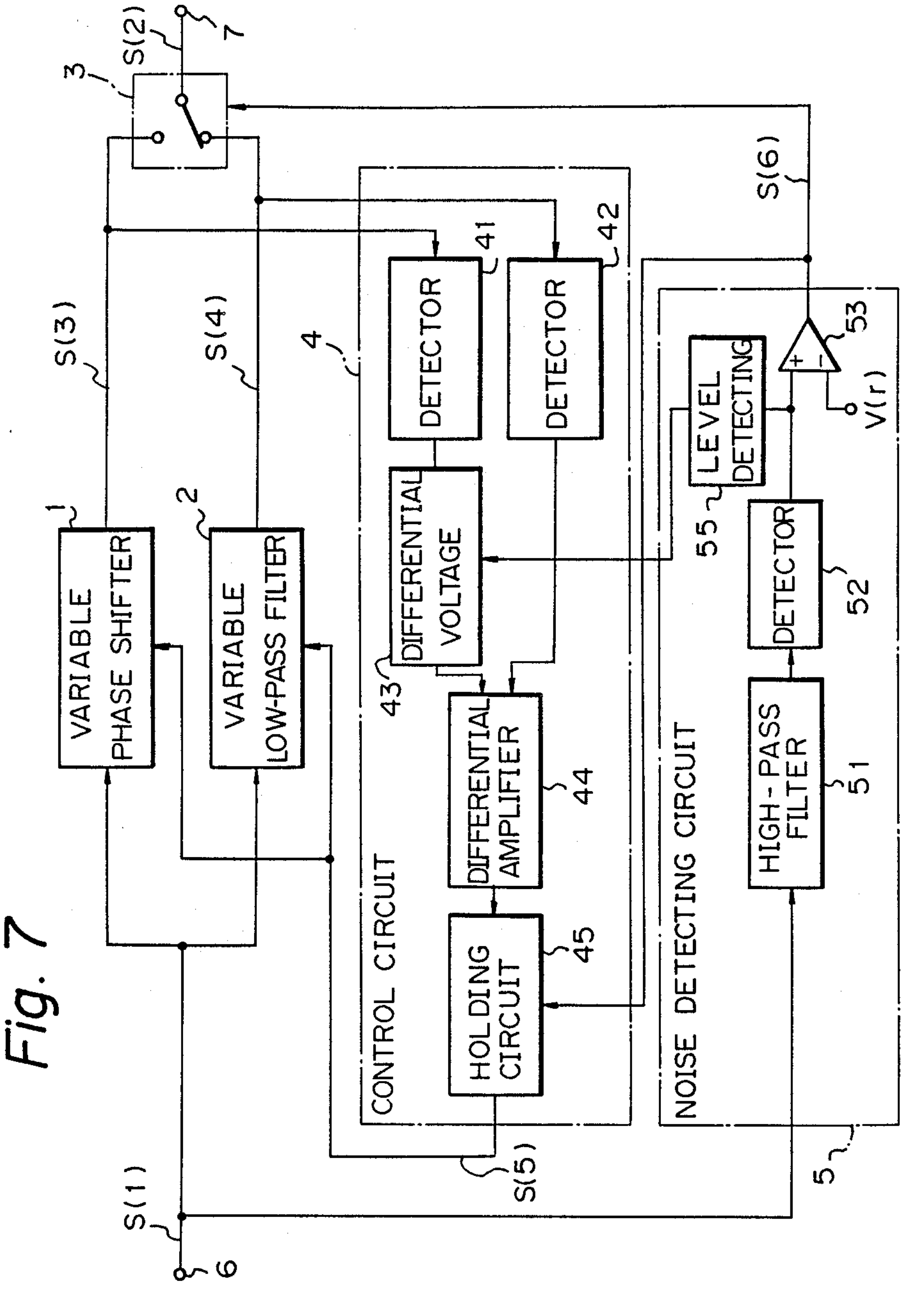
FIG. 7 is a block diagram of still another embodiment of the present invention.

FIG. 7 is a block diagram of still another modification of the present invention. In this modified apparatus, the noise reduction operation can be more effectively performed when the noise level is large. That is, a level detecting circuit 55 for detecting a noise level is provided at the noise detecting circuit 5, and the magnitude of the differential voltage $\delta$ of the differential voltage circuit 43 is made to be increased as the magnitude of the detection signal increases, whereby the degree of shift of the cut-off frequency of the variable low-pass filter 2 toward the low frequency side becomes larger when the noise level is increased.

As still another modification, the input signals of the control circuit 4 may be obtained from the input and output sides of the variable low-pass filter 2 instead of from the output signals of the variable phase shifter 1 and the variable low-pass filter 2, as in the embodiment described above. When a delay of the signal at the variable low-pass filter can be neglected, the variable phase shifter may be omitted and the input signal S(1) may be directly supplied to the detector 41. A phase shifter having a fixed phase shift amount may be used instead of the variable phase shifter.

Figure 8:
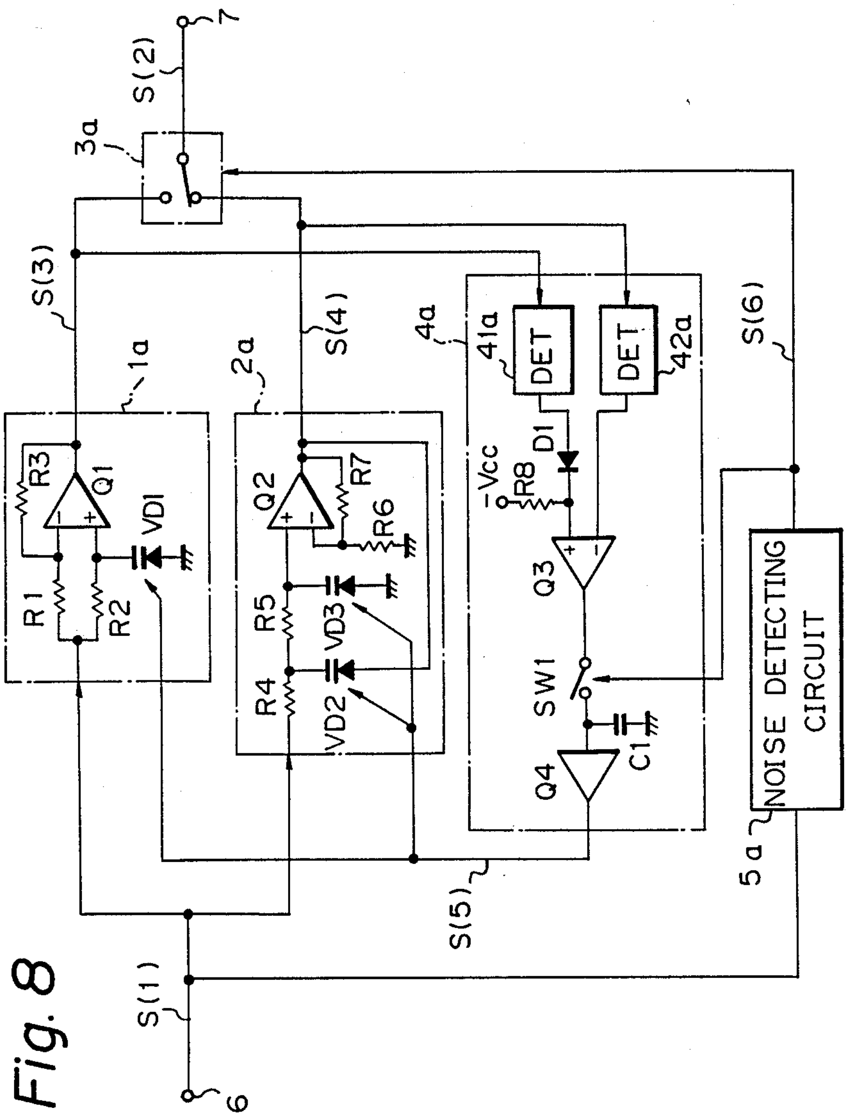
FIG. 8 is a block diagram in which the noise reduction apparatus in FIG. 1 is realized in an analog circuit.

FIG. 8 shows an embodiment wherein the noise reduction apparatus of FIG. 1 is realized by an analog circuit. In FIG. 8, a variable phase shifter is comprises resistors R1 to R3, an operational amplifier Q1, and a variable capacitance diode VD1, and the phase shift amount of the variable phase shifter is can be varied in accordance with a voltage applied to the variable capacitance diode VD1. A variable low-pass filter 2*a* comprises resistors R4 to R7, variable capacitance diodes VD2 and VD3, and an operational amplifier Q2, and the cut-off frequency of the variable low-pass filter 2*a* can be changed by varying a voltage applied to the variable capacitance diodes VD2 and VD3.

A control circuit 4*a* comprises detectors 41*a* and 42*a* each having an analog circuit, a differential voltage circuit having a resistor R8 and a diode D1 for supplying a differential voltage δ, a differential amplifier having an operational amplifier Q3, and a holding circuit having a switching element SW1, a capacitor C1, and an operational amplifier Q4. The operation of the apparatus in FIG. 8 is substantially the same as that of the apparatus in FIG. 1, and therefore, a detailed description thereof will be omitted.

Figure 9:
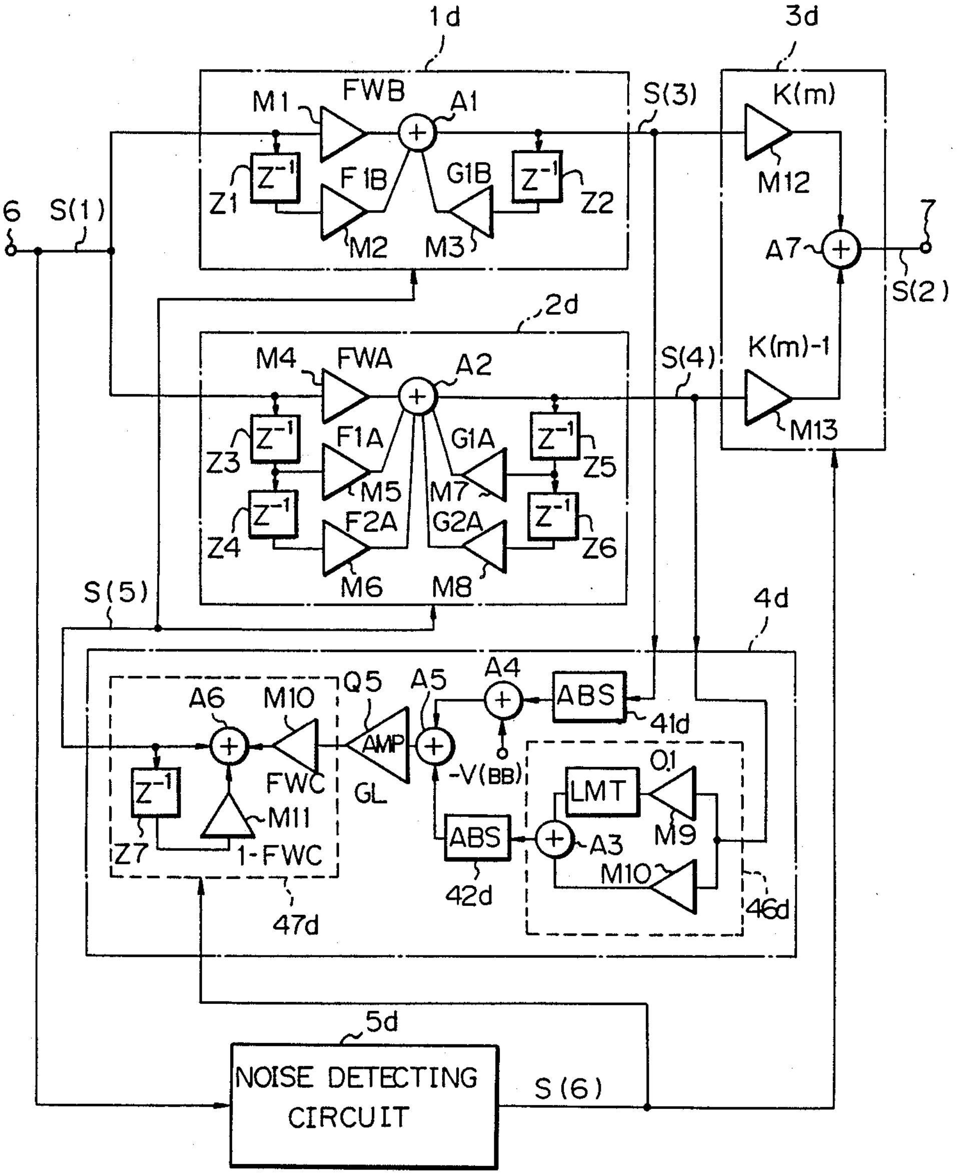
FIG. 9 is a block diagram in which the noise reduction apparatus in FIG. 5 is realized in a digital circuit.

FIG. 9 is a block diagram of an embodiment in which the noise reduction apparatus in FIG. 5 is constituted by a digital circuit. In FIG. 9, a variable low-pass filter 2*d* is realized by a second-order digital filter. A transfer function H(s) of the filter is, $$H(s) = \frac{1}{1 + H_1 S + H_2 S^2}$$

Assuming that the cut-off frequency is $f_c$, a Z conversion of $$H_1 \frac{1}{2}\pi f_c$$

$$H_2 = 0.67 H_1$$

yields:

$$H(Z) = \frac{1 + 2Z^{-1} + Z^{-2}}{(1 + Ha + Hb) + 2(1 - Hb)Z^{-1} + (1 - Ha + Hb)Z^{-2}}$$

where $$Ha = 2H_1/T \qquad Hb = 2.67 \cdot H_1^2/T^2$$

Therefore, this digital filter has an arrangement as shown in FIG. 9.

Assuming that $H_1' = 10^3/2\ f_c$ and $H_1'$ is continuously varied, then $H_1'$ is determined by a feedback loop. In order to obtain the cut-off frequency $f_c$ of 200 Hz to 6.4 kHz, $H_1'$ is determined to be 0.8 to 0.025. If $H_1'$ exceeds this range, it is held at the upper or lower limit thereof. That is, $H_1' = 0.8$ when $H_1' > 0.8$, and $H_1 = 0.025$ when $H_1' < 0.025$. Each constant in the variable low-pass filter can be obtained by the following sequence:

① $Ha = H_1' \times 76$
② $Hb = H_1'^2 \times 3850$
③ $FWA = 1/(1 + Ha + Hb)$
④ $F2A = FWA$
⑤ $F1A = 2 \times FWA$
⑥ $G1A = -FIA \times (1 - Hb)$
⑦ $G2A = -FWA \times (1 - Ha + Hb)$ A variable phase shifter 1*d* is realized by a first-order digital filter. A transfer function H(s) of the phase shifter is, $$H(s) = \frac{1 - S\tau}{1 + S\tau}$$

A condition for matching the phase of the phase shifter with that of the above-mentioned variable low-pass filter is, $$\tau = 0.67/2\pi f_c$$

where each constant in the variable phase shifter can be obtained by the following order;

① $K = 51 \times H_1'$
② $FWB = (1 - K)/(1 + K)$
③ $F1B = 1$
④ $G1B = -FWB$

A selector 3*d* comprises constant multipliers M12 and M13 and an adder A7, and changes a constant Km from 1 to 0 when noise is detected, thereby switching from the variable phase shifter 1*d* to the variable low-pass filter 2*d*.

A constant control circuit 4*d* comprises absolute value circuits 41*a* and 42*d* each serving as a detector, a nonlinear amplifier 46*d*, and adder A4 serving as a difference voltage circuit, an adder A5 and an amplifier Q5 serving as a differential amplifier, and a loop filter 47*d* having a function as a holding circuit.

The nonlinear amplifier 46*d* comprises a constant multiplier M9 having a constant of 0.1, a limiter LMT for clipping an input level of an input signal×0.1 or more, a constant multiplier M10 having a constant of 0.9, and adder A3. The circuit 46*d* has an input to output characteristic as shown in FIG. 6 for an input signal. Thus, the cut-off frequency of the variable low-pass filter 2*d* is increased as the input signal level increases, so that the noise reduction effect is large when the input signal level is low and is small when the input signal level is high, thereby more effectively performing a noise reduction process.

The loop filter 47*d* includes constant multipliers M10 and M11, a delay element Z7, and an adder A6, and a constant FWC becomes 0 when noise is detected. That is, the constant multiplier M10 is actuated and the constant multiplier M11 is cut-off in a normal operation so that an input signal is sent to the output side. When noise is detected, the constant multiplier M10 is cut-off and the constant multiplier M11 is actuated so that an input signal is circulated in a loop constituted by the adder A6, the delay element Z7, and the constant multiplier M11, to hold the input signal. The $H_1'$ of the variable phase shifter 1*d* and the variable low-pass filter 2*d* is controlled by using the output of the loop filter 47*d*.

The operation of the apparatus in FIG. 9 is basically the same as that of the apparatus in FIG. 5, and therefore, a detailed description thereof will be omitted.

Figure 10:
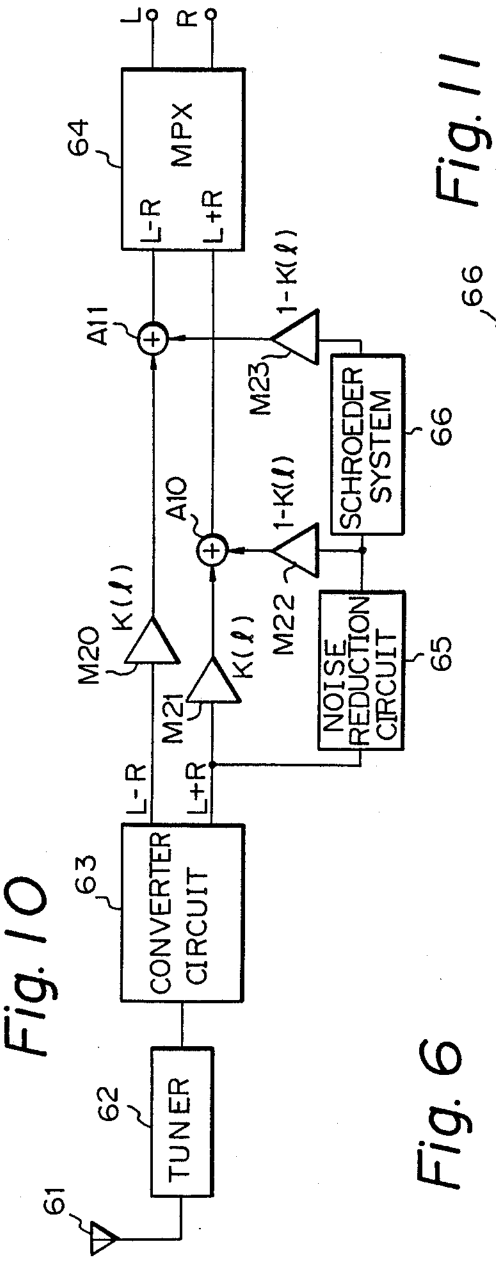
FIG. 10 is a schematic view of an example in which the noise reduction apparatus of the present invention is applied to an FM radio receiver.

FIG. 10 is a schematic view of an example wherein the noise reduction apparatus of the present invention is applied to an FM radio receiver. A noise reduction operation for stereo broadcasting should be preferably performed in both right and left channels L and R, respectively. However, two circuits are required as the noise reduction circuits in this case, resulting in a high cost. Therefore, in general, a receiver is set to be in a monaural mode during a period in which noise is generated and the noise reduction operation is performed only for a monaural signal of L+R.

However, the stereophonic effect is lost during noise reduction processing because the mode is switched from stereo to monaural, and the sound seems to aurally fluctuate when noise is intermittently and frequently generated. The receiver shown in FIG. 10 eliminates the problem. That is, this receiver performs the noise reduction processing only for a demodulated L+R signal and passes the L+R signal after noise reduction through the delay circuit to generate a pseudo L−R signal, thereby obtaining output signals L and R of both channels from the pseudo L−R signal.

Figure 11:
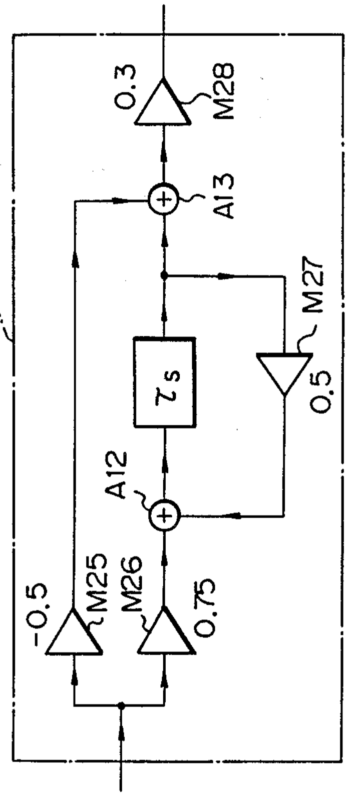
FIG. 11 is a block diagram showing a delay circuit of FIG. 10 in detail.

In FIG. 10, a reference numeral 61 denotes an antenna; 62, a tuner; 63, a converter circuit for extracting the L+R signal and L−R signal from the detection signal; 64, a multiplexer for extracting the output signals L and R of both channels from the L+R signal and the L−R signal; 65, a noise reduction circuit according to the present invention; 66, a delay circuit; M20 to M23, constant multipliers; and A10 and A11, adders. An example of the noise reduction circuit 65 has the circuit configuration as shown in FIG. 1. A so-called Schroeder system as shown in FIG. 11 is used as the delay circuit 66. The delay circuit 66 comprises constant multipliers M25 to M28, adders A12 and A13, and a 72-sample (about 2 ms) delay element $\tau s$. The multiplied constants of the constant multipliers M25 to M28 are denoted in FIG. 10. The L+R signal passes through this Schroeder system to form a reverberation sound which can serve as the pseudo L−R signal.

The operation of the receiver in FIG. 6 will now be described. In a normal condition, a constant K(l) of each of the constant multipliers M20 to M23 is set to be 1, and the constant multipliers M20 and M21 are actuated and the constant multipliers M22 and M23 are cut-off, so that the L+R signal and the L−R signal of the converter circuit 63 are directly supplied to the multiplexer 64. On the other hand, throughout a period in which instantaneous noise is generated, the constant K(l) is set to be 0, and the constant multipliers M20 and M21 are cut-off and the constant multipliers M22 and M23 are actuated, so that the L+R signal from the noise reduction circuit 65 and the pseudo L−R signal from the delay circuit 66 are supplied to the multiplexer 64.

CAPABILITY OF EXPLOITATION IN INDUSTRY

A noise reduction apparatus according to the present invention is suitable for removing an intermittently generated noise, can be used as, e.g., a noise reduction apparatus of an FM radio receiver, and can remove a multipath distortion generated in an FM radio receiver.

I claim:

1. A noise reduction apparatus for removing noise superimposed on an input signal having a phase and a frequency including a major component, comprising:

noise detecting circuit means for detecting the noise in the input signal;

first signal path means including a variable low-pass filter having a variable cut-off frequency that varies in response to a control signal, for receiving the input signal and for providing an output responsive the input signal and said variable cut-off frequency so that the output includes all frequencies below the cut-off frequency;

second signal path means for receiving and providing as an output the input signal;

control circuit means for providing the control signal for controlling the cut-off frequency of said low-pass filter such that said cut-off frequency is varied in accordance with the frequency of the input signal; and selecting circuit means for selecting the output signal from said first signal path means when noise is detected by said noise detecting circuit means and for selecting the output signal from said second signal path when the noise is not detected.

2. An apparatus according to claim 1, wherein said control circuit control means includes:

means for controlling the cut-off frequency so that it substantially coincides with the major component of the input signal.

3. An apparatus according to claim 1, wherein said control circuit means includes:

means for comparing the output signal of said first signal path means with the output signal of said second signal path means and for controlling the cut-off frequency of said variable low-pass filter in accordance with the comparison result.

4. An apparatus according to claim 3, wherein said control circuit means further includes:

means for controlling the output signals of said first and second signal path means so as to substantially coincide with each other, based on the comparison result.

5. An apparatus according to claim 3, wherein said control circuit means further includes:

means for controlling the output signals of said first and second signal path means so as to generate a predetermined difference between these signals, based on the comparison result.

6. An apparatus according to claim 1, wherein said control circuit means includes:

holding circuit means for fixing an output signal of said control circuit means to a level that was outputted just before the noise was detected by said noise detecting circuit means.

7. An apparatus according to claim 1, wherein said second signal path means includes:

phase shifter means for phase shifting the input signal.

8. An apparatus according to any one of claims 1 to 6, wherein said low pass filter has a phase-frequency characteristic and said second signal path means includes:

variable phase shifter means, having a phase-frequency characteristic, for shifting the phase of the input signal by an amount based on an output signal of said control circuit means; and means for controlling the amount of phase shift by said variable phase shifter means so that said variable phase shifter has the same phase-frequency characteristic as that of said low-pass filter.

9. An apparatus according to claim 3, wherein said control circuit means further comprises:

first detector means for detecting the output signal of said second signal path means and for providing an output responsive to said detection;

second detector means for detecting an output signal of said variable low-pass filter and for providing an output responsive to said detection;

differential voltage supply circuit means for varying the output of one of said first and second detector means;

differential amplifier means for differentially amplifying the output of the other one of said second and first detector means and said differential voltage supply circuit means; and holding circuit means for holding an output signal of said differential amplifier to be constant when the noise is detected by said noise detection circuit means.

10. An apparatus according to claim 1, wherein said noise detecting circuit means has a variable sensitivity, and includes:

means for varying the sensitivity so that the sensitivity is decreased as the frequency of the input signal is increased, so that noise reduction processing is suppressed as the frequency of the input signal increases.

11. An apparatus according to claim 10, wherein said noise detecting circuit means includes means for varying the sensitivity in accordance with an output signal of said control circuit.

12. An apparatus according to claim 1, wherein the input signal has a level, and said control circuit means includes:

means for controlling the cut-off frequency of said low-pass filter in accordance with the frequency of the input signal so that the cut-off frequency is higher when the input signal level is high than when the input signal level is low.

13. An apparatus according to claim 1, wherein the noise has a level and said apparatus further comprises:

means for detecting the noise level; and means for controlling the cut-off frequency of said low-pass filter in accordance with the frequency of the input signal so that the cut-off frequency is lower when a detected noise level is high than when the detected noise level is low.

14. An apparatus according to claim 1, wherein said control circuit means includes:

means for comparing the signal received by said first signal path means and the signal outputted by said first signal path means; and means for providing feedback-control such that both signals substantially coincide with each other so as to regulate the cut-off frequency of said variable low-pass filter.

15. An apparatus according to claim 1, wherein said apparatus comprises an analog circuit.

16. An apparatus according to claim 1, wherein said apparatus comprises a digital circuit.

* * * * *

UNITED STATES PATENT AND TRADEMARK OFFICE

CERTIFICATE OF CORRECTION

PATENT NO. : 4,910,799

DATED : March 20, 1990

INVENTOR(S) : Kazuo Takayama

It is certified that error appears in the above-identified patent and that said Letters Patent is hereby corrected as shown below:

Col. 9, line 33, "(1)" should be --(ℓ)--;
line 41, "(1)" should be --(ℓ)--.

Col. 10, line 22, "for" should be --for feedback--.

Col. 11, line 4, "supply" should be --supplying--.

Signed and Sealed this

Ninth Day of July, 1991

Attest:

HARRY F. MANBECK, JR.

Attesting Officer

Commissioner of Patents and Trademarks